(12) United States Patent
Chang et al.

(10) Patent No.: US 8,637,862 B2
(45) Date of Patent: Jan. 28, 2014

(54) DEVICE HOUSING AND METHOD FOR MAKING THE SAME

(75) Inventors: Hsin-Pei Chang, Tu-Cheng (TW);
Wen-Rong Chen, Tu-Cheng (TW);
Huann-Wu Chiang, Tu-Cheng (TW);
Cheng-Shi Chen, Tu-Cheng (TW);
Ying-Ying Wang, Shenzhen (CN)

(73) Assignees: Hong Fu Jin Precision Industry (ShenZhen) Co., Ltd, Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 313 days.

(21) Appl. No.: 13/087,512

(22) Filed: Apr. 15, 2011

(65) Prior Publication Data
US 2012/0018340 A1 Jan. 26, 2012

(30) Foreign Application Priority Data

Jul. 21, 2010 (CN) .......................... 2010 1 0232894

(51) Int. Cl.
*H01L 29/10* (2006.01)
(52) U.S. Cl.
USPC ...................... 257/43; 257/613; 257/E21.532
(58) Field of Classification Search
USPC .................................................. 257/E21.532
See application file for complete search history.

(56) References Cited

U.S. PATENT DOCUMENTS

2005/0191513 A1* 9/2005 Hartig et al. .................. 428/627

* cited by examiner

*Primary Examiner* — Cheung Lee
(74) *Attorney, Agent, or Firm* — Altis Law Group, Inc.

(57) ABSTRACT

A device housing is provided. The device housing includes a substrate, a silicon dioxide film formed on the substrate, and a zinc oxide film formed on the silicon dioxide film. The silicon dioxide film has micrometer sized structures. The zinc oxide film has nanometer sized structures. A method for making the device housing is also described there.

7 Claims, 1 Drawing Sheet

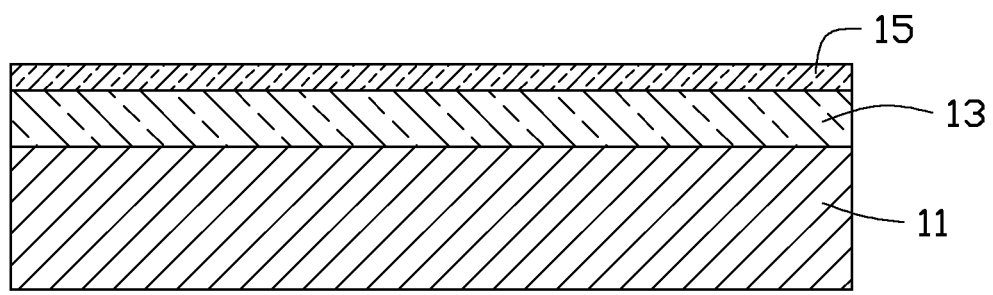

DEVICE HOUSING AND METHOD FOR MAKING THE SAME

BACKGROUND

1. Technical Field

The present disclosure relates to device housings, particularly to a device housing having waterproof and self cleaning properties and a method for making the device housing.

2. Description of Related Art

Electronic device housings are usually coated with waterproof films for prevention of water absorption. These waterproof films are commonly formed by painting with waterproof paint. However, the waterproof paint is usually not environmental friendly.

Other kinds of waterproof films have been applied without using waterproof paint. For example, a nano-silicon dioxide film is formed on the device housing as the waterproof film. The static contact angle between the nano-silicon dioxide film and water drop on the film may be large. The contact angle is defined by an included angle between the surface of the film and the tangent line of the water drop. However, the dynamic contact angle between the nano-silicon dioxide film and the water drop is also large. Accordingly, the water drop may slip off from the nano-silicon dioxide film, and may be difficult to clean away the contamination from the film. The nano-silicon dioxide film is not self-cleaning.

Therefore, there is room for improvement within the art.

BRIEF DESCRIPTION OF THE FIGURES

Many aspects of the device housing can be better understood with reference to the following figures. The components in the figures are not necessarily drawn to scale, the emphasis instead being placed upon clearly illustrating the principles of the device housing. Moreover, in the drawings like reference numerals designate corresponding parts throughout the several views.

The FIGURE is a cross-section view of an exemplary embodiment of a device housing.

DETAILED DESCRIPTION

The FIGURE shows a device housing 10 according to an exemplary embodiment. The device housing 10 includes a substrate 11, a silicon dioxide film 13 formed on a surface of the substrate 11, and a zinc oxide film 15 formed on the silicon dioxide film 13.

The substrate 11 may be made of metal or non-metal material. The metal may be selected from a group consisting of stainless steel, aluminum, aluminum alloy, copper, copper alloy, and zinc. The non-metal material may be plastic, ceramic, glass, or polymer.

The silicon dioxide film 13 has micrometer sized structures, and micro dimensional surface roughness, so there is minimal dynamic contact angle between the silicon dioxide film 13 and a water drop. The static contact angle between the silicon dioxide film 13 and the water drop is large, so the silicon dioxide film 13 has a waterproof property. The silicon dioxide film 13 may be transparent.

The zinc oxide film 15 has nanometer sized structures, and the surface of the zinc oxide film 15 defines with zinc oxide nano-stick arrays, so there is a large static contact angle between the zinc oxide film 15 and a water drop, which gives the zinc oxide film 15 a waterproof property. The zinc oxide film 15 may be transparent.

The total thickness of the silicon dioxide film 13 and the zinc oxide film 15 is less than 1 μm, and 0.1-0.5 μm in this exemplary embodiment.

As mentioned above, the silicon dioxide film 13 and the zinc oxide film 15 may form a micro-nano-meter composite coat having both a large static contact angle and a small dynamic contact angle. If a water drop drips on the zinc oxide film 15, the water drop slips off the zinc oxide film 15 and simultaneously cleans away contaminant (such as dust or sweat) covering the zinc oxide film 15. That is, the device housing 10 has both the waterproof property and the self cleaning property.

A method for making the device housing 10 may include the following steps:

The substrate 11 is provided. The substrate 11 may be made of metal or non-metal materials. The metal material may be selected from a group consisting of stainless steel, aluminum, aluminum alloy, copper, copper alloy, and zinc. The non-metal material may be plastic, ceramic, glass, or polymer.

The silicon dioxide film 13 is formed on the substrate 11. The silicon dioxide film 13 may be formed by a sol-gel process. The sol-gel process may include the following steps:

A sol is provided. The sol may contain tetraethyl orthosilicate, ethanol, hydrochloric acid and deionized water. Tetraethyl orthosilicate, ethanol, hydrochloric acid (36.5%), and deionized water may be measured at a volume ratio of about 1-5:1:0.01-0.05:1-25 and mixed together to get a mixture. The mixture is then agitated for about 1-5 hours to form the sol.

The substrate 11 is dipped in the sol and then removed from the sol at a uniform speed. The surfaces of the substrate 11 are therefore attached with sol-gel film after the substrate 11 is removed. The sol-gel film is dried in the atmosphere first and then heated to form the silicon dioxide film 13. Heating the sol-gel films may be implemented in a furnace with a temperature of about 200-400° C. During the heating process, organic matter contained in the sol-gel films is eliminated.

The zinc oxide film 15 is formed on the silicon dioxide film 13 by vacuum sputtering. Vacuum sputtering the zinc oxide film 15 may be implemented as following:

The substrate 11 having the silicon dioxide film 13 is positioned in a plating chamber of a vacuum sputtering equipment (not shown). The plating chamber is fixed with a zinc target therein. The plating chamber is then vacuum pumped to be $4.0 \times 10^{-3}$ Pa and heated to about 20-300° C. Oxygen ($O_2$) may be used as a reaction gas and injected into the chamber at a flow rate of about 20-300 standard-state cubic centimeter per minute (sccm), and argon (Ar) may be used as a working gas and injected into the chamber at a flow rate of about 100-400 sccm. The power of the zinc target is then turned on, and the zinc target may be biased with negative bias voltage to deposit the zinc oxide film 15 on the silicon dioxide film 13. The negative bias voltage may be about −100V to about −300 V. Depositing the zinc oxide film 15 may last for about 20-60 minutes.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A device housing, comprising:
   a substrate;
   a silicon dioxide film having micrometer sized structures formed on the substrate; and a zinc oxide film having nanometer sized structures formed on the silicon dioxide film, the zinc oxide film defining zinc oxide nano-stick arrays on the surface of the zinc oxide film.

2. The device housing as claimed in claim 1, wherein the silicon dioxide film has a micro dimensional surface roughness.

3. The device housing as claimed in claim 1, wherein the silicon dioxide film and the zinc oxide film have a total thickness of less than 1 μm.

4. The device housing as claimed in claim 1, wherein the silicon dioxide film and the zinc oxide film have a total thickness of about 0.1-0.5 μm.

5. The device housing as claimed in claim 1, wherein the silicon dioxide film and the zinc oxide film are transparent.

6. The device housing as claimed in claim 1, wherein the substrate is made of metal or non-metal material.

7. The device housing as claimed in claim 6, wherein the metal is selected from a group consisting of stainless steel, aluminum, aluminum alloy, copper, copper alloy, and zinc; the non-metal is plastic, ceramic, glass, or polymer.

* * * * *